(12) United States Patent
Yamada

(10) Patent No.: US 10,557,868 B2
(45) Date of Patent: Feb. 11, 2020

(54) WAFER INSPECTION DEVICE AND WAFER INSPECTION METHOD

(71) Applicant: TOKYO ELECTRON LIMITED, Tokyo (JP)

(72) Inventor: Hiroshi Yamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 29 days.

(21) Appl. No.: 15/763,723

(22) PCT Filed: Jul. 14, 2016

(86) PCT No.: PCT/JP2016/071464
§ 371 (c)(1),
(2) Date: Mar. 27, 2018

(87) PCT Pub. No.: WO2017/056654
PCT Pub. Date: Apr. 6, 2017

(65) Prior Publication Data
US 2018/0299487 A1   Oct. 18, 2018

(30) Foreign Application Priority Data
Sep. 30, 2015   (JP) .................. 2015-194389

(51) Int. Cl.
*G01R 1/067*     (2006.01)
*G01R 31/28*     (2006.01)
*G01R 1/04*      (2006.01)

(52) U.S. Cl.
CPC ....... *G01R 1/06794* (2013.01); *G01R 1/0491* (2013.01); *G01R 31/2831* (2013.01)

(58) Field of Classification Search
CPC ........... G01R 1/06794; G01R 31/2831; G01R 1/0491; G01N 21/8851; G01N 21/9501; G01N 35/1074
USPC ..... 324/500, 750.03–750.07, 754.01–754.11, 324/754.21–755.01, 758.01, 724, 149
See application file for complete search history.

(56) References Cited

U.S. PATENT DOCUMENTS

2004/0164756 A1* 8/2004 Suzuki ............... G01R 31/2851
                                                        324/756.03
2011/0316571 A1* 12/2011 Kiyokawa .......... G01R 31/2891
                                                        324/750.16

FOREIGN PATENT DOCUMENTS

| JP | 6-2166 6-21166 A | 1/1994 |
| JP | 6-2166 A | 1/1994 |
| JP | 2000-55971 A | 2/2000 |
| JP | 2012-199508 A | 10/2012 |
| JP | 2014-75420 A | 4/2014 |

(Continued)

OTHER PUBLICATIONS

International Search Report dated Oct. 18, 2016 issued in corresponding International Application No. PCT/JP2016/071464.

*Primary Examiner* — Melissa J Koval
*Assistant Examiner* — Trung Nguyen
(74) *Attorney, Agent, or Firm* — Nath, Goldberg & Meyer; Stanley N. Protigal; Jerald L. Meyer

(57) ABSTRACT

The present disclosure provides a wafer inspection device that can perform accurate inspection. The wafer inspection device includes a probe card having a plurality of contact probes formed to protrude toward a wafer W, a chuck top on which the wafer W is mounted and configured to move toward the probe card, and an aligner configured to adjust inclination of the chuck top relative to the probe card.

9 Claims, 9 Drawing Sheets

(56) References Cited

FOREIGN PATENT DOCUMENTS

KR   10-2012-0028282 A   3/2012

* cited by examiner

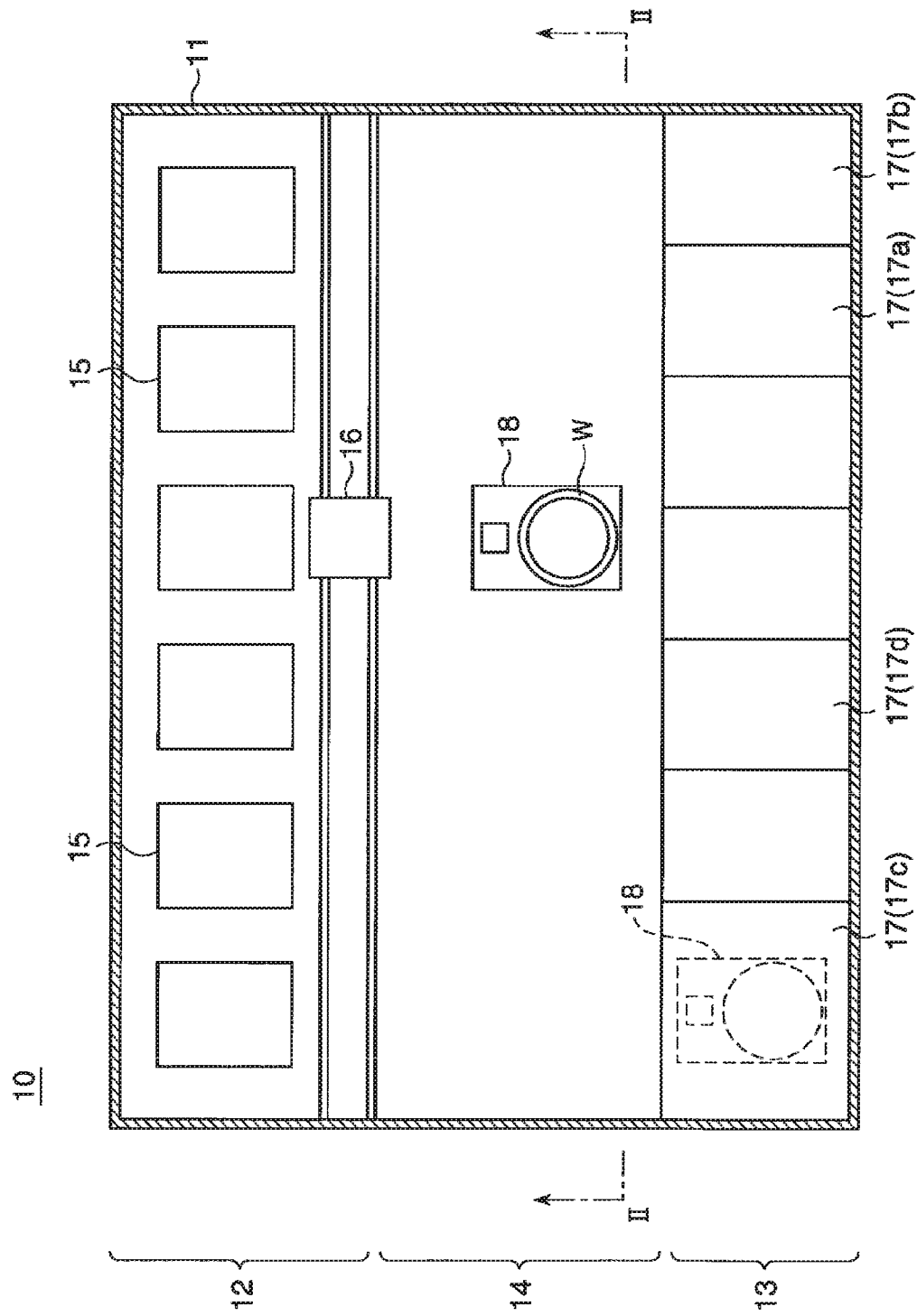

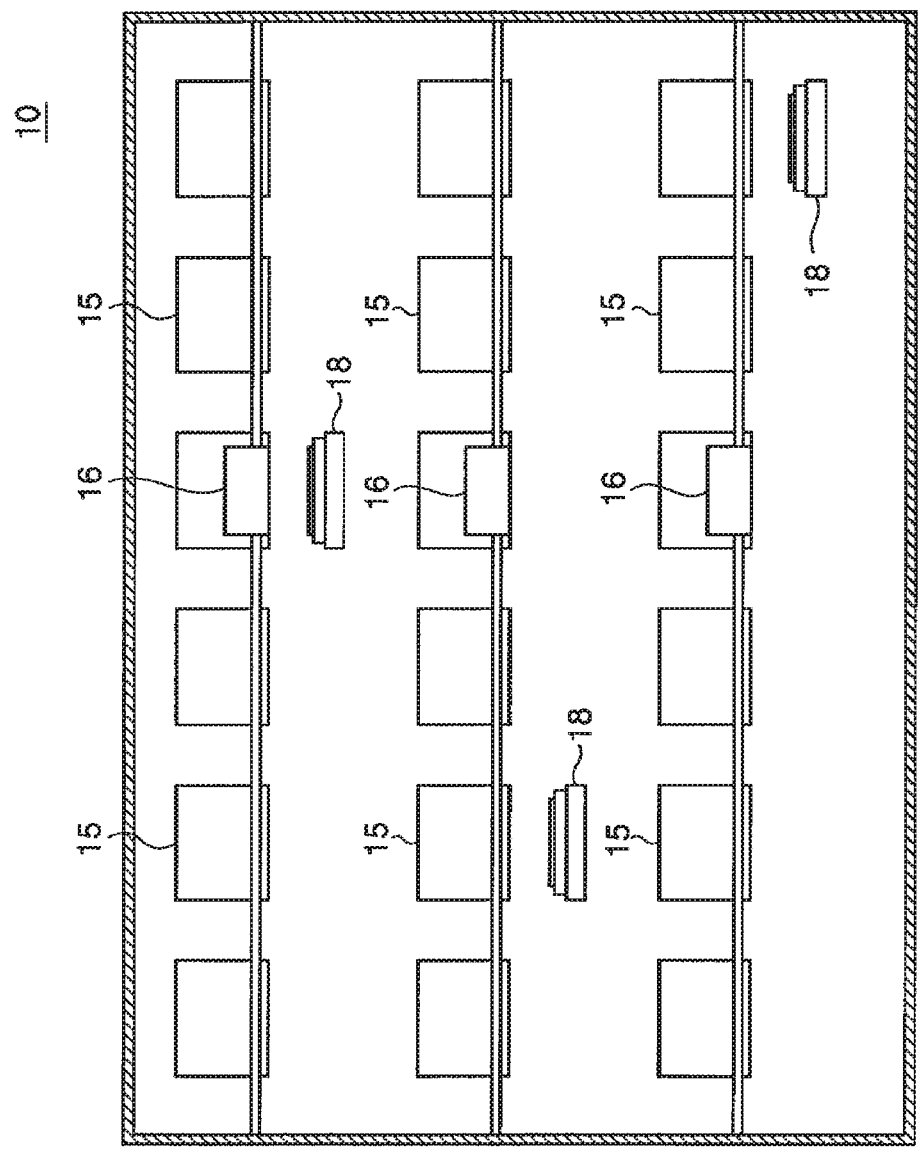

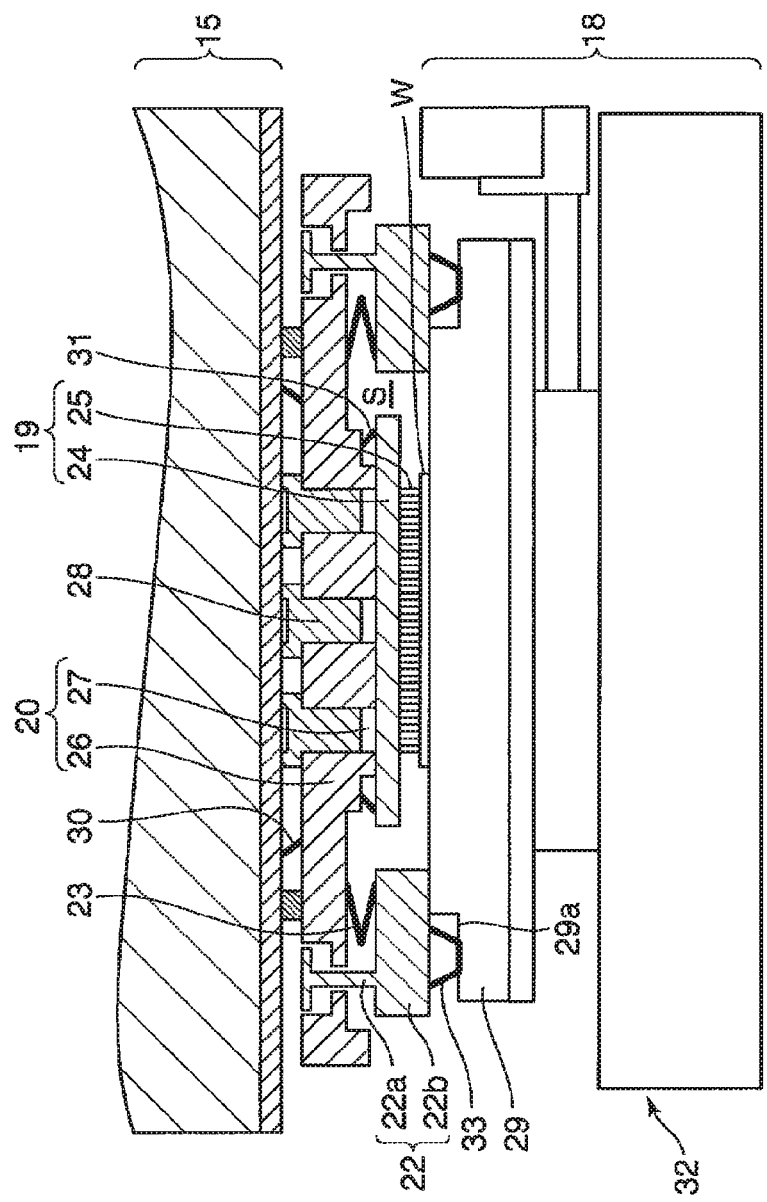

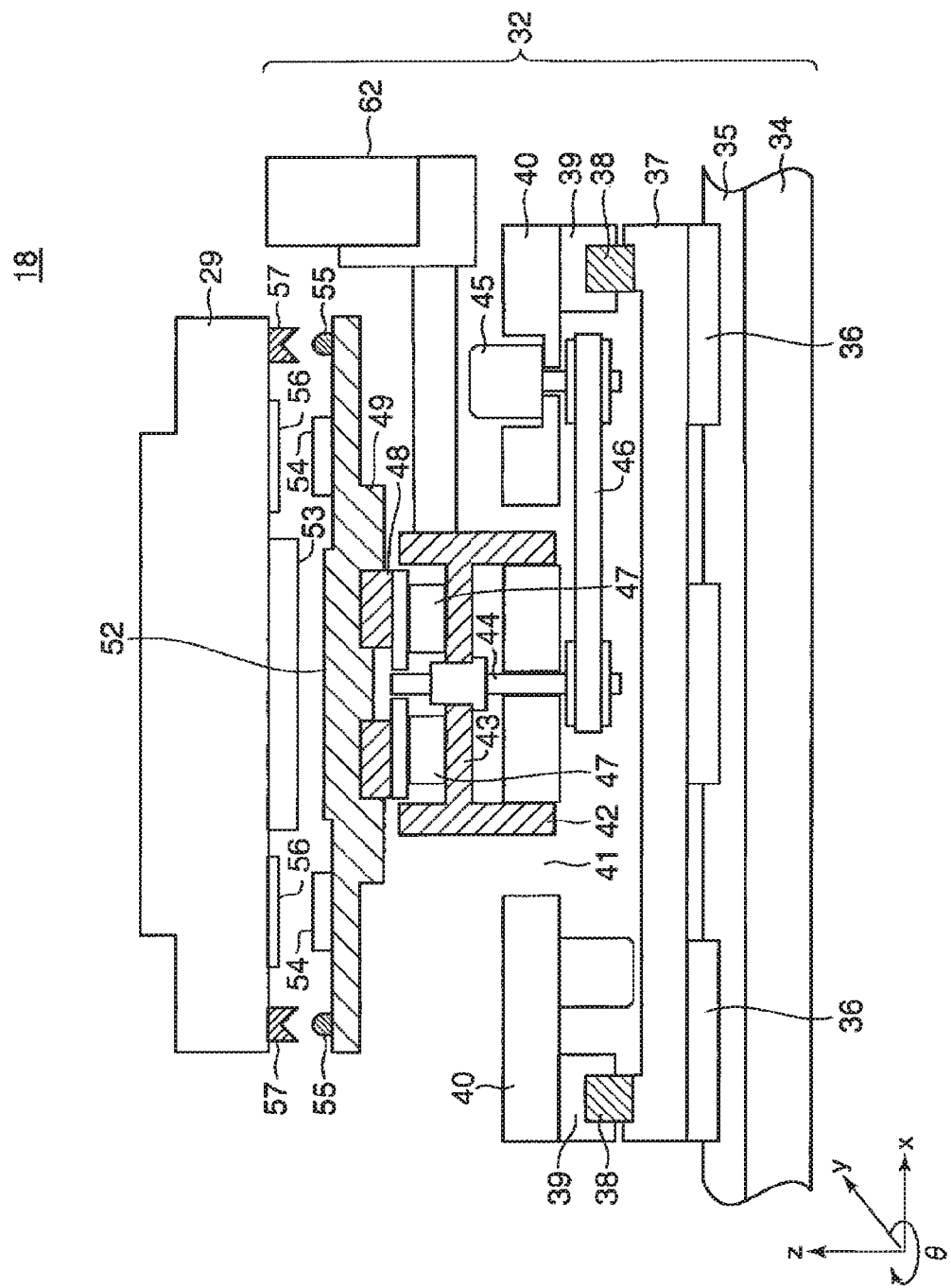

WAFER INSPECTION DEVICE AND WAFER INSPECTION METHOD

This is a National Phase Application filed under 35 U.S.C. 371 as a national stage of PCT/JP2016/071464, filed Jul. 14, 2016, an application claiming the benefit of Japanese Application No. 2015-194389, filed Sep. 30, 2015, the content of each of which is hereby incorporated by reference in its entirety.

TECHNICAL FIELD

The present disclosure relates to a wafer inspection device using a probe card for wafer inspection, and a wafer inspection method.

BACKGROUND

A prober, which is an inspection device for inspecting a wafer with a plurality of semiconductor device formed thereon, includes a probe card equipped with contact probes that are rod-shaped contact terminals. The probe card is brought into contact with a wafer such that the contact probes come into contact with electrode pads or solder bumps of semiconductor devices. Further, electric current is applied from the contact probes to electrical circuits respectively connected to the electrode pads or solder bumps in the semiconductor devices. In this way, conductive states of the electrical circuits are inspected.

Recently, in order to improve inspection efficiency of a wafer, there has been developed a wafer inspection device that includes a plurality of probe cards and can inspect semiconductor devices formed on the wafer with another probe card while the wafer is conveyed to a certain probe card by a conveying stage. In such a wafer inspection device, when wafers are brought into contact with the probe cards, respectively, in order to prevent wrapping of the wafers, a wafer W is mounted on a chuck top 100 that is a thick plate (FIG. 10A) and then a space between a probe card 101 and the chuck top 100 is evacuated to bring the wafer W and the probe card 101 into contact with each other (FIG. 10B) (see Patent Document 1).

To accurately inspect a wafer using a wafer inspection device requires bringing probes of a probe card uniformly into contact with respective electrode pads or respective solder bumps of semiconductor devices. As such, the wafer is brought into contact with the probe card in a parallel relationship with each other.

However, in recent years, inspection conditions for wafer inspection are complicated, and in particular, inspection is performed under high-temperature environments or low-temperature environments in many cases.

PRIOR ART DOCUMENT

Patent Document (Patent Document 1): Japanese Patent Application No. 2014-75420

However, under high-temperature environments or low-temperature environments, a probe card or a chuck top may be deformed due to thermal expansion or thermal contraction. As a result, the probe card or the chuck top may be inclined. At this time, it is difficult to maintain a wafer mounted on the chuck top in a parallel relationship with the probe card. This makes it difficult to bring probes uniformly into contact with electrode pads or solder bumps, respectively, when bringing the wafer into contact with the probe card. That is to say, it is difficult to accurately inspect the wafer using the conventional wafer inspection device.

SUMMARY

Some embodiments of the present disclosure provide a wafer inspection device and a wafer inspection method capable of accurately inspect a wafer.

According to one embodiment of the present disclosure, there is provided a wafer inspection device including a plurality of tester rows composed of a plurality of testers that is horizontally arranged and a conveying stage provided for each of the plurality of tester rows, including: a first camera disposed for each of the plurality of tester rows and configured to move along a respective tester row of the plurality of tester rows, wherein each of the plurality of testers includes a probe card having a plurality of contact terminals formed to protrude toward a wafer, and the conveying stage is configured to mount the wafer thereon and to move toward the probe card, wherein the conveying stage includes an aligner and a chuck top mounted on the aligner, the aligner and the chuck top being separated from each other, the wafer is mounted on the chuck top, the aligner includes an inclination adjusting mechanism configured to adjust an inclination of the chuck top relative to the probe card, the wafer inspection device further comprising: an inclination checking mechanism configured to check a degree of inclination of the chuck top and a degree of inclination of the probe card, wherein the inclination checking mechanism includes the first camera and a second camera, the first camera being configured to check the degree of inclination of the chuck top and the second camera being disposed in the aligner and configured to check the degree of inclination of the probe card.

A wafer inspection method of bringing a probe card into contact with a wafer mounted on a chuck top, in a wafer inspection device including a plurality of tester rows composed of a plurality of testers that is horizontally arranged and a conveying stage provided for each of the plurality of tester rows, each of the plurality of testers being provided with the probe card having a plurality of contact terminals formed to protrude toward the wafer, and the conveying stage being provided with an aligner and the chuck top mounted on the aligner, the method including: an inclination checking step of checking a degree of inclination of the chuck top and a degree of inclination of the probe card, an inclination adjusting step of adjusting the inclination of the chuck top relative to the probe card; and a moving step of moving the chuck top with the wafer mounted thereon toward the probe card; and disposing a first camera for each of the plurality of tester rows, the first camera being configured to move along a respective tester row of the plurality of tester rows, wherein the inclination checking step includes: allowing the first camera to check the degree of inclination of the chuck top; and allowing a second camera disposed in the aligner to check the degree of inclination of the probe card.

According to the present disclosure, since the inclination of a chuck top relative to a probe card is adjusted, it is possible to maintain a wafer mounted on the chuck top in a parallel relationship with the probe card. Accordingly, even if the probe card or the chuck top is inclined, it is possible to bring contact terminals in uniformly contact with electrode pads or solder bumps of semiconductor devices formed on a wafer under high-temperature or low-temperature environments. Therefore, it is possible to accurately inspect the wafer using the wafer inspection device.

BRIEF DESCRIPTION OF THE DRAWINGS

FIG. 1 is a horizontal cross-sectional view schematically showing the configuration of a wafer inspection device according to an embodiment of the present disclosure.

FIG. 2 is a cross-sectional view taken along line II-II in FIG. 1.

FIG. 3 is a side view schematically showing the configuration of a conveying stage and a tester shown in FIGS. 1 and 2.

FIG. 4 is a view showing the configuration of the conveying stage shown in FIG. 3.

DETAILED DESCRIPTION

Figure 5A:
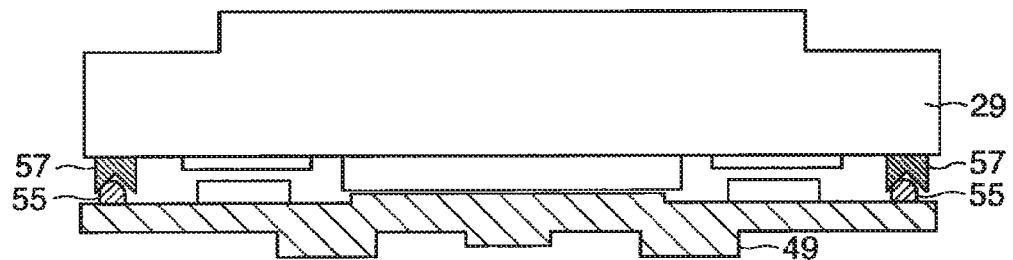
FIGS. 5A and 5B are views showing a process of setting a position of a chuck top with respect to an aligner.

Hereinafter, embodiments are described with reference to drawings.

First, a wafer inspection device according to an embodiment will be described.

FIG. 1 is a horizontal cross-sectional view schematically showing the configuration of the wafer inspection device according to an embodiment, and FIG. 2 is a cross-sectional view taken along line II-II in FIG. 1.

Referring to FIGS. 1 and 2, a wafer inspection device 10 includes an inspection chamber 11. The inspection chamber 11 has an inspection section 12 in which electrical characteristics of semiconductor devices formed on a wafer W are inspected, an loading/unloading section 13 through which the wafer W is loaded into and unloaded from the inspection chamber 11, and a conveying section 14 disposed between the inspection section 12 and the loading/unloading section 13.

A plurality of testers 15 used as a plurality of interfaces for wafer inspection is disposed in the inspection section 12. Specifically, the inspection section 12 has a three-layered tester row structure composed of a plurality of testers that is horizontally arranged. A single tester-side camera 16 (inclination-checking mechanism) is disposed for each of the tester rows. Each of the tester-side cameras 16 horizontally move along the respective tester row, and is located at the front of each tester 15 in the tester row to check the position of a wafer or the like which is conveyed by a conveying stage 18 (to be described below) or checks the degree of inclination of a chuck top 29 (to be described below).

The loading/unloading section 13 has a plurality of divided reception spaces 17 defined therein. A port 17a into which a FOUP as a container for receiving a plurality of wafers is loaded, an aligner 17b for performing a wafer alignment, a loader 17c through which a probe card 19 is loaded and unloaded, and a controller 17d for controlling operations of respective components of the wafer inspection device 10, are disposed in the respective reception spaces 17.

The conveying stage 18 configured to move to the conveying section 14, the inspection section 12 and the loading/unloading section 13 is disposed in the conveying section 14. The conveying stage 18 is provided for each of the tester rows. The conveying stage 18 takes the wafer W out of the port 17a of the loading/unloading section 13 and conveys the same to each tester 15. In addition, the conveying stage 18 conveys the wafer W for which the electrical characteristics of semiconductor devices have been inspected to the respective port 17a from the respective tester 15.

In the wafer inspection device 10, each of the testers 15 inspects the electrical characteristics of the semiconductor devices formed on the wafer W conveyed thereto. While the conveying stage 18 conveys a wafer W toward a certain tester 15, another tester 15 is configured to inspect the electrical characteristics of semiconductor devices formed on another wafer W. Thus, it is possible to improve wafer inspection efficiency.

FIG. 3 is a side view schematically showing the configuration of the conveying stage and the tester shown in FIGS. 1 and 2. FIG. 3 is also a cross-sectional view mainly showing the configuration of the conveying stage 18 and shows a state in which the wafer W is brought into contact with the probe card 19 of the tester 15 by the conveying stage 18.

In FIG. 3, the tester 15 is disposed on a pogo frame 20 which is fixed to a device frame (not shown). The probe card 19 is installed below the pogo frame 20. A flange 22 that can vertically move with respect to the pogo frame 20 is engaged with the pogo frame 20. A cylindrical bellows 23 is disposed between the pogo frame 20 and the flange 22.

The probe card 19 includes a disc-shaped body 24, a plurality of electrodes (not shown) disposed to be flush with an upper surface of the body 24, and a plurality of contact probes 25 (contact terminals) disposed to protrude downward from a lower surface of the body 24 in FIG. 3. Each of the electrodes is connected to the respective contact probe 25. Each of the contact probes 25 comes into contact with electrode pads or solder bumps of semiconductor devices formed on a wafer W when the wafer W is brought into contact with the probe card 19.

The pogo frame 20 includes a body 26 having a substantially flat plate shape and a plurality of pogo block-inserting holes 27 that are a plurality of through-holes bored in the vicinity of the central portion of the body 26. Pogo blocks 28 formed by arranging a plurality of pogo pins are inserted into the pogo block-inserting holes 27, respectively. The pogo block 28 is connected to an inspection circuit (not shown) of the tester 15 and is brought into contact with the plurality of electrodes formed on the body 24 of the probe card 19 attached to the pogo frame 20. The pogo block 28 transmits electric current to each of the contact probes 25 which are connected to the electrodes of the probe card 19. The pogo block 28 flows the electric current coming from the electrical circuits of the semiconductor devices of the wafer W through the contact probes 25, toward the inspection circuit.

The flange 22 includes a cylindrical body 22a and a ring-shaped contact portion 22b formed below the body 22a and is disposed to surround the probe card 19. As described below, the flange 22 is moved downward such that the lower surface of the contact portion 22b is positioned downward relative to tips of the contact probes 25 of the probe card 19 by its own weight, until the chuck top 29 is brought into contact with the flange 22. The bellows 23 is formed in a metal serpentine structure and can vertically expand and contract. Upper and lower ends of the bellows 23 are respectively in close contact with the upper surface of the contact portion 22b of the flange 22 and the lower surface of the pogo frame 20.

In the tester 15, a space between the pogo frame 20 and a base 21 is sealed by a sealing member 30. The pogo frame 20 is attached to the base 21 by evacuating the space. Further, a space between the pogo frame 20 and the probe card 19 is sealed by a sealing member 31. The probe card 19 is attached to the pogo frame 20 by evacuating the space.

The conveying stage 18 includes the chuck top 29 composed of a thick plate member and an aligner 32 (inclination adjusting mechanism). The chuck top 29 is mounted on the aligner 32. The wafer W is mounted on an upper surface of the chuck top 29. The chuck top 29 is vacuum-attracted to the aligner 32. The wafer W is vacuum-attracted to the chuck top 29. Accordingly, it is possible to prevent the wafer W from moving relative to the conveying stage 18 when the conveying stage 18 is moved. The method of holding the chuck top 29 and the wafer W is not limited to the vacuum attraction, and may use any method as long as it is possible to prevent the movement of the chuck top 29 and the wafer W relative to the aligner 32. As an example, a method using electromagnetic attraction or clamps may be employed. A stepped portion 29a is formed around the periphery of the upper surface of the chuck top 29. A sealing member 33 is disposed in the stepped portion 29a.

The conveying stage 18 is movable. Thus, the conveying stage 18 moves below the probe card 19 of the tester 15 so that the wafer W mounted on the chuck top 29 can be positioned to face the probe card 19 of the tester 15 and the wafer W can be moved toward the tester 15. A space S surrounded by the chuck top 29, the flange 22, the pogo frame 20 and the probe card 19, which is formed when the chuck top 29 is brought into contact with the contact portion 22b of the flange 22 and the wafer W is brought into contact with the probe card 19, is sealed by the bellows 23 and the sealing member 33. By evacuating the space S, the chuck top 29 is held by the probe card 19 so that the wafer W mounted on the chuck top 29 is brought into contact with the probe card 19. At this time, the electrode pads or solder bumps of the semiconductor devices formed on the wafer W are brought into contact with the contact probes 25 of the probe card 19, respectively. Further, in the wafer inspection device 10, the movement of the conveying stage 18 is controlled by the controller 17d. The controller 17d determines the position or the movement amount of the conveying stage 18.

On the other hand, in consideration of complicated inspection conditions at the time of performing the wafer inspection, a temperature adjusting mechanism (not shown) such as a heater or coolant channel is incorporated in the probe card 19 of each tester 15 (more precisely, the pogo frame 20) to perform the wafer inspection under high-temperature or low-temperature environments. In the wafer inspection performed under such high-temperature or low-temperature environments, the probe card 19 or the chuck top 29 may be deformed due to the radiation of heat from the heater or the absorption of heat into the coolant channel. As a result, the probe card 19 or the chuck top 29 may be inclined. This may make it difficult to hold the wafer W mounted on the chuck top 29 in a parallel relationship with the probe card 19. In this embodiment, the aligner 32 adjusts the inclination of the chuck top 29 relative to the probe card 19 in order to address the aforementioned difficulty.

FIG. 4 is a view showing the configuration of the conveying stage shown in FIG. 3. For the sake of easier understanding, FIG. 4 is drawn such that the interior of the aligner 32 is revealed. In addition, the chuck stop 29 is shown to be spaced apart from the aligner 32. In FIG. 4, the left-right direction is referred to as an X-direction, the vertical direction is referred to as a Z-direction, the depth direction is referred to as a Y-direction, and the rotational direction around the Z-direction is referred to as a θ-direction.

Referring to FIG. 4, the aligner 32 includes an X-base 34 as a plate-shaped member, a rail-shaped X-guide 35 extending in the X-direction on the X-base 34, a plurality of X-blocks 36 that is engaged with the X-guide 35 and is movable in the X-direction, a Y-base 37 as a plate-shaped member supported by the X-blocks 36, a rail-shaped Y-guide 38 extending in the Y-direction on the Y-base 37, a plurality of Y-blocks 39 that is engaged with the Y-guide 38 and is movable in the Y-direction, and a Z-base 40 as a plate-shaped member supported by the Y-blocks 39. As the X-blocks 36 move in the X-direction, the Y-base 37 can be moved with respect to the X-base 34 in the X-direction. As the Y-blocks 39 move in the Y-direction, the Z-base 40 can be moved with respect to the Y-base 37 or the X-base 34 in the Y-direction.

Figure 5B:
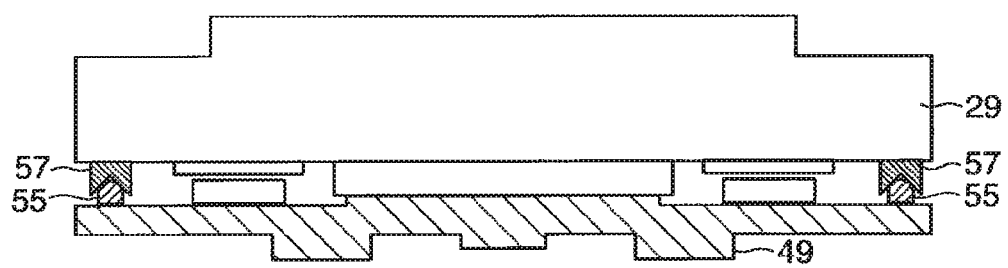

A Z-block hole 41 is formed at the center of the Z-base 40. A Z-block 42 having an H-shaped cross-section is loosely inserted into the Z-block hole 41. The Z-block 42 has a flange-shaped portion 43 formed therein. The flange-shaped portion 43 is threadedly coupled with a ball screw 44 extending in the Z-direction. The ball screw 44 rotates around its rotation axis by rotational force transmitted from a Z-axial motor 45 through a driving belt 46. The flange-shaped portion 43, which is threadedly coupled with to the ball screw 44 in rotation, is moved in the Z-direction. As a result, the Z-block 42 is moved in the Z-direction along a guide (not shown). A plurality of actuators 47 is disposed on an upper surface of the flange-shaped portion 43. Each of the actuators 47 supports a disc-shaped chuck base 49 through a roller ring 48. The roller ring 48 includes a θ-direction driving mechanism (not shown) to support the chuck base 39 such that the chuck base 39 can be rotated in the θ-direction. The number of actuators 47 may be two or more. For example, three actuators 47 may be disposed. Alternatively, two actuators 47 and one height fixing member (not shown) may be disposed. The chuck base 39 is rotated in the θ-direction by a structure (not shown). The chuck base 49 has a chuck top attraction 52 at the center portion of an upper surface of the chuck base 49. A bottom plate 53 of the chuck top 29 is vacuum-attracted to the chuck top attraction 52. In this manner, the chuck top 29 is mounted on and attached to the aligner 32. Further, the chuck base 49 includes a plurality of height sensors 54 arranged around a peripheral portion of the upper surface of the chuck base 49, and positioning pins 55 each having a semispherical upper end. On the other hand, the chuck top 29 includes a plurality of inspection plates 56 arranged at locations facing the respective height sensors 54 on the lower surface of the chuck top 29, and a plurality of positioning blocks 57 arranged at locations facing the respective positioning pins 55 on the lower surface of the chuck top 29. A lower end of each of the positioning blocks 57 is formed in a conical shape is engaged with the semispherical upper end of the respective positioning pin 55. In this embodiment, a combination of the positioning blocks 57 and the positioning pins 55 constitutes a position setting mechanism. As the positioning blocks 57 are engaged with the respective positioning pins 55, the position of the chuck top 29 with respect to the chuck base 49 (the aligner 32) is set. Incidentally, when the positioning blocks 57 are engaged with the respective positioning pins 55, as shown in FIG. 5A, lower ends of the positioning blocks 57 are brought into partially contact with the semispherical upper ends of the positioning pins 55. As such, the positioning blocks 57 are not accurately engaged with the respective positioning pins 55 in some cases. In this case, the chuck top 29 may be deviated with respect to the aligner 32. For this reason, even if the inclination of the chuck top 29 is adjusted by the aligner 32, the degree of inclination of the chuck top 29 may not be adjusted at a desired level. In consideration of such a concern, in this embodiment, after the chuck top 29 is mounted on the aligner 32, a position setting operation of sliding the chuck base 49 of the aligner 32 in at least one of the X-direction, the Y-direction, the Z-direction, and the θ-direction is executed. Accordingly, the state of the contact between the lower ends of the positioning blocks 57 and the semispherical upper ends of the positioning pins 55 is improved by moving the chuck base 49 with respect to the chuck top 29, whereby the positioning blocks 57 are accurately engaged with the respective positioning pins 55 (a position setting step) (FIG. 5B). The position setting operation may be performed immediately after the chuck top 29 is mounted on the aligner 32. Alternatively, the position setting operation may be performed immediately before a wafer alignment adjusting process to be described below is performed.

Returning to FIG. 4, the aligner 32 includes an upper checking camera 62 (inclination checking mechanism) configured to check the degree of inclination of the probe card 19 or the pogo frame 20. The upper checking camera 62 is disposed on the Z-block 42. In the aligner 32, the actuators 47 lift the chuck base 49. The lifting amount of each of the actuators 47 can be individually adjusted. That is to say, it is possible to adjust the inclination of the chuck base 49, ultimately the inclination of the chuck top 29 by making the lifting amounts of the actuators 47 different.

Figure 6:
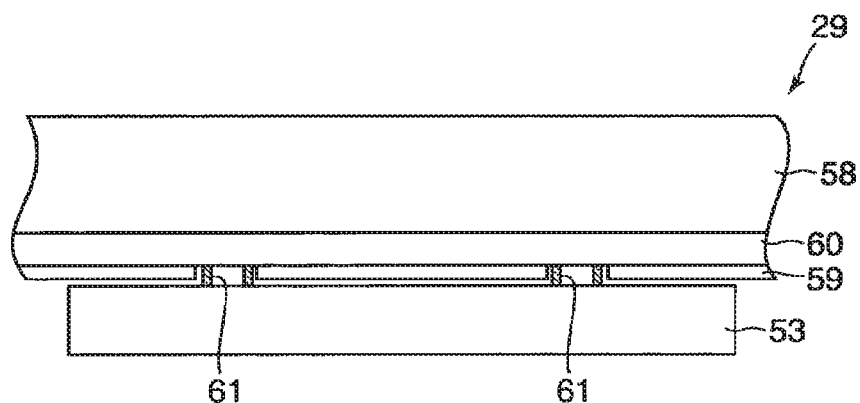
FIG. 6 is a view explaining an insulation structure of the chuck top shown in FIG. 3.

FIG. 6 is a view showing an insulation structure of the chuck top shown in FIG. 3.

Referring to FIG. 6, the chuck top 29 includes a body 58 made of a thick plate member, a bottom plate 53 attached to an lower surface of the body 58, and a cooler 60 and a heater 59 that are disposed between the bottom plate 53 and the body 58. The bottom plate 53 is disposed at a slight clearance from the body 58, specifically the cooler 60 or the heater 59. The body 58 and the bottom plate 53 are connected to each other through a cylindrical insulation collar 61. This prevents the cooler 60 from absorbing heat radiated from the aligner 32 through the bottom plate 53 and further prevents heat radiated from the heater 59 from transferring to the aligner 32 through the bottom plate 53. Thus, it is possible to improve the temperature controllability of the chuck top 29. Further, since the insulation collar 61 is disposed between the body 58 and the bottom plate 53, it is possible to prevent the bottom plate 53 from being influenced by thermal contraction or thermal expansion of the body 58, which is caused by the cooler 60 or the heater 59. As a result, deformation of the bottom plate 53 can be suppressed, thus stably attracting the chuck top 29 to the aligner 32.

Next, a wafer inspection method according to this embodiment will be described.

FIGS. 7A, 7B, 8A, and 8B are views showing a process of attaching the chuck top to the probe card in the wafer inspection method according to this embodiment.

Figure 7A:
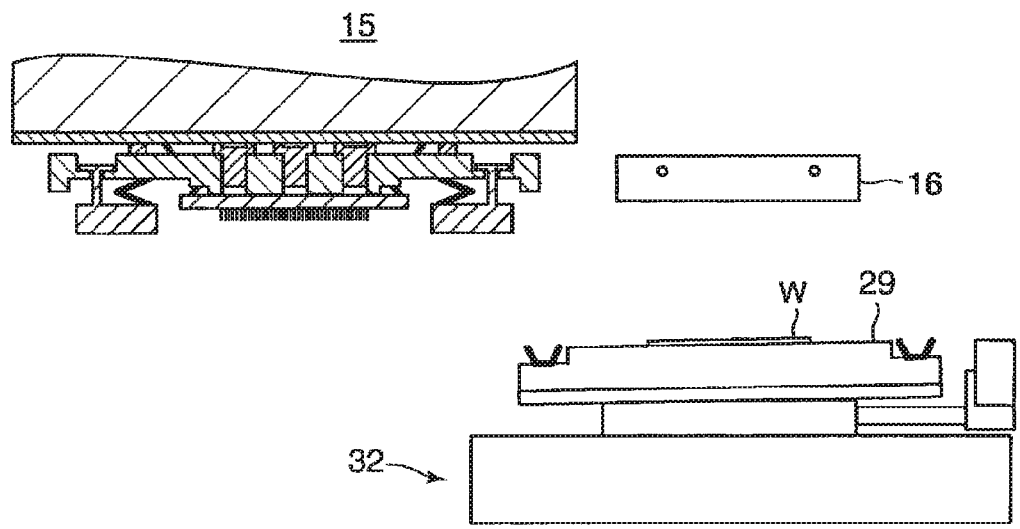
FIGS. 7A and 7B are views showing a process of attaching a chuck top to a probe card in a wafer inspection method according to an embodiment of the present disclosure.
Figure 7B:
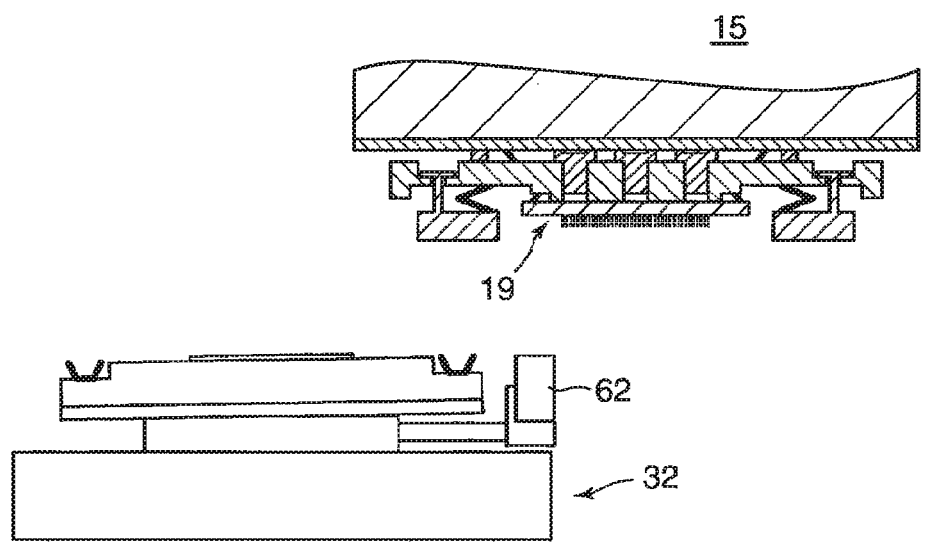

First, the chuck top 29 is attracted to the aligner 32. The height sensors 54 measure distances from the height sensors 54 to the respective inspection plates 56. When the measured distances fall outside a preset tolerance, the attraction of the chuck top 29 to the aligner 32 is stopped and the aforementioned position setting operation is performed. Subsequently, the chuck top 29 is attracted to the aligner 32 again, and the height sensors 54 measure distances from the height sensors 54 to the respective inspection plates 56 again. A series of such operations is performed until the measured distances fall within the preset tolerance. Thereafter, the chuck top 29 with the wafer W mounted thereon is moved just in front of a certain tester 15 by the conveying stage 18 (the aligner 32) and the chuck top 29 is located to face the tester-side camera 16 (FIG. 7A). At this time, the tester-side camera 16 checks the degree of inclination of the chuck top 29 (the inclination checking step). Thereafter, the aligner 32 is moved toward the tester 15 and the upper checking camera 62 of the aligner 32 is located to face the probe card 19 (FIG. 7B). At this time, the upper checking camera 62 checks the degree of inclination of the probe card 19 (the inclination checking step).

Figure 8A:
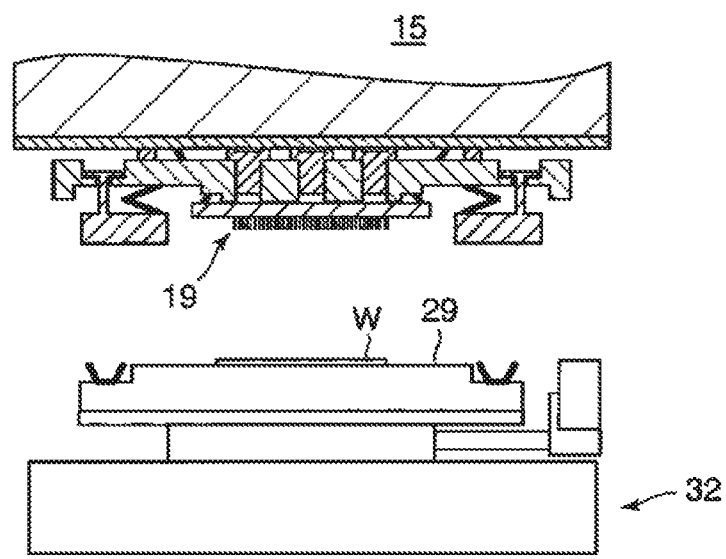
FIGS. 8A and 8B are views showing a process of attaching a chuck top to a probe card in a wafer inspection method according to an embodiment of the present disclosure.
Figure 8B:
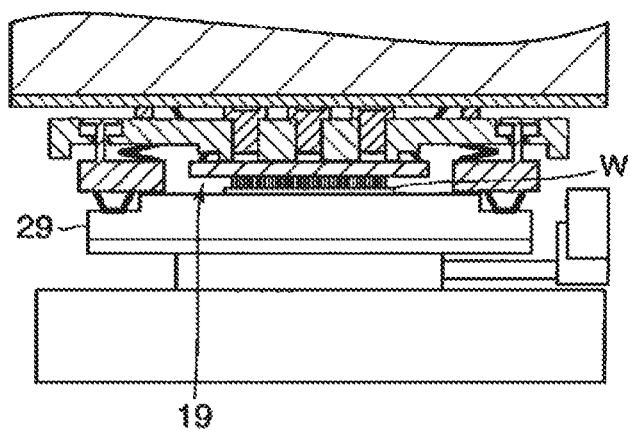

Subsequently, the aligner 32 and the chuck top 29 are moved toward the tester 15 such that the wafer W mounted on the chuck top 29 faces the probe card 19. The degree of inclination of the chuck top 29 for maintaining the wafer W in a parallel relationship with the probe card 19 is calculated based on the checked degree of inclination of the chuck top 29 and the checked degree of inclination of the probe card 19. Further, the inclination of the chuck base 49 relative to the probe card 19 is adjusted by the actuators 47 to achieve the calculated degree of inclination of the chuck top 29 (an inclination adjusting step) (FIG. 8A). Thereafter, the probe card 19 is moved to the chuck top 29 so that the wafer W and the probe card 19 are brought into contact with each other (a moving step) (FIG. 8B). At this time, the space S is evacuated so that the chuck top 29 is held by the probe card 19.

According to the processes shown in FIGS. 7A, 7B, 8A, and 8B, the inclination of the chuck top 29 relative to the probe card 19 is adjusted such that the wafer W mounted on the chuck top 29 is maintained in a parallel relationship with the probe card 19. Accordingly, even if the probe card 19 or the chuck top 29 is inclined during the measurement under high-temperature or low-temperature environments, it is possible to maintain the wafer W in a parallel relationship with the probe card 19 by adjusting the inclination of the chuck top 29 relative to the probe card 19. As a result, it is possible to bring the probes 25 uniformly into contact with the electrode pads or solder bumps of the semiconductor devices formed on the wafer W, thus performing an accurate inspection in the wafer inspection device 10.

Further, in the processes shown in FIGS. 7A, 7B, 8A, and 8B, since the degrees of inclination of the probe card 19 and the chuck top 29 are checked, it is possible to accurately find out the inclination of the chuck top 29 relative to the probe card 19, thus accurately calculating the degree of inclination of the chuck top 29 for maintaining the wafer W in a parallel relationship with the probe card 19. For example, in terms of throughput, any one of the degrees of inclination of the probe card 19 and the chuck top 29 may be checked, and the degree of inclination of the chuck top 29 for maintaining the wafer W in a parallel relationship with the probe card 19 may be calculated.

In the wafer inspection device 10, in some cases, heaters or coolant channels may be incorporated in the probe card 19 of each tester 15 or the chuck top 29, and the degrees of inclination of the probe cards 19 or the chuck tops 29 may be different from each other. However, by adjusting the inclination of the chuck top 29 relative to each probe card 19 with the aligner 32, it is possible to maintain the wafer W in a parallel relationship with each probe card 19 even in any testers 15. As a result, it is possible to accurately inspect the plurality of wafers W using the plurality of probe cards 19, thus improving inspection efficiency of the wafers W.

Further, in the wafer inspection device 10, the positioning blocks 57 are accurately engaged with the respective positioning pins 55 by the sliding of the aligner 32, so that the position of the chuck top 29 with respect to the aligner 32 is set. Accordingly, it is possible to accurately adjust the degree of inclination of the chuck top 29 at a desired level when adjusting the inclination of the chuck top 29 using the aligner 32. As a result, it is possible to reliably maintain the wafer W in a parallel relationship with the probe card 19.

While in the processes shown in FIGS. 7A, 7B, 8A and 8B, the degree of inclination of the chuck top 29 for maintaining the wafer W in a parallel relationship with the probe card 19 has been described to be calculated, and the inclination of the chuck base 49 has been described to be adjusted by the actuators 47 to achieve the calculated degree of inclination of the chuck top 29, it is not easy to accurately achieve the calculated degree of inclination of the chuck top 29 due to a change in lifting amount of each actuator 47 or the like. In this embodiment, the inclination of the chuck base 49 is repeatedly adjusted to address such concern, thus accurately achieving the calculated degree of inclination of the chuck top 29.

Figure 9:
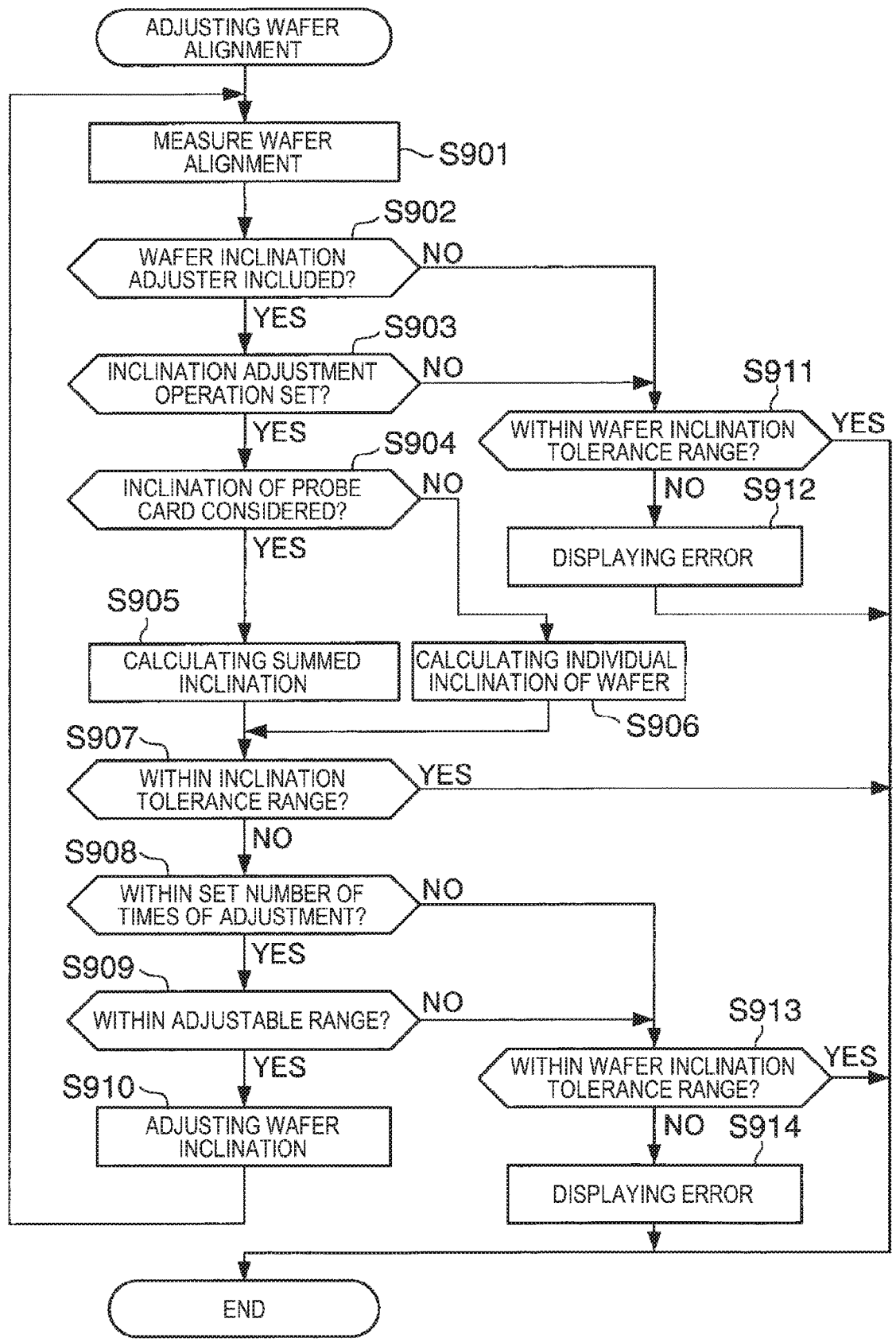
FIG. 9 is a flow chart showing a wafer alignment adjusting process in the wafer inspection method according to an embodiment of the present disclosure.
Figure 10A:
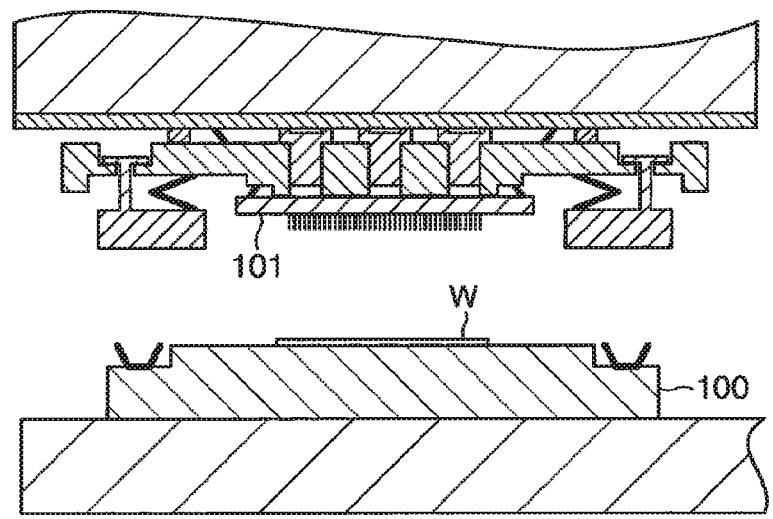
FIGS. 10A and 10B are views showing a process of attaching a chuck top to a probe card in a conventional wafer inspection method.
Figure 10B:
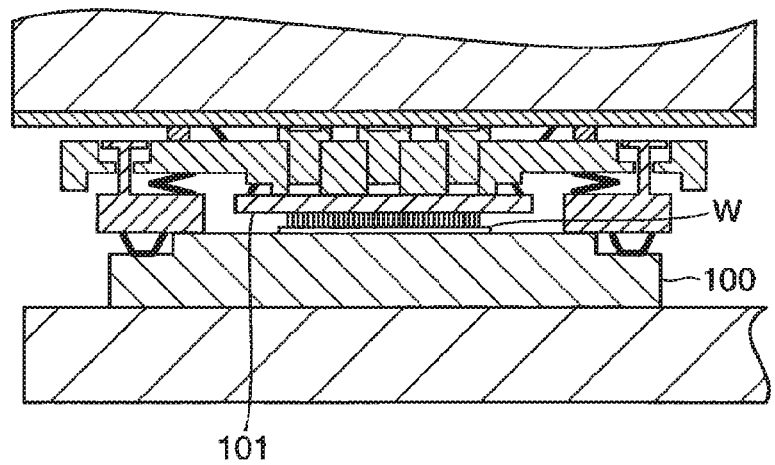

FIG. 9 is a flow chart showing a wafer alignment adjusting process in the wafer inspection method according to an embodiment.

First, an wafer alignment is measured by checking the degree of inclination of the chuck top 29 or the probe card 19 by the tester-side camera 16 or the upper checking camera 62 (Step S901). Subsequently, it is determined whether the wafer inspection device 10 includes a wafer inclination adjusting mechanism, namely the actuators 47 in this embodiment (Step S902). If it is determined that the wafer inspection device 10 includes the wafer inclination adjusting mechanism, it is determined whether an inclination adjustment operation (an operation of adjusting the inclination of the chuck base 49 using the aligner 32) has been set in the wafer inspection device 10 (Step S903). If the inclination adjustment operation has been set, it is determined whether to consider the inclination of the probe card 19 in the inclination adjustment, specifically whether to consider the degree of inclination of the probe card 19 when calculating the degree of inclination of the chuck top 29 for maintaining the wafer W in a parallel relationship with the probe card 19 (Step S904). In the case where the inclination of the probe card 19 is considered, the degree of inclination of the wafer W relative to the probe card 19 (which is a summed inclination) is calculated by summing the degree of inclination of the chuck top 29 and the degree of inclination of the probe card 19 (Step S905). Meanwhile, in the case where the inclination of the probe card 19 is not considered, the degree of inclination of the wafer W relative to the probe card 19 (which is a wafer-alone inclination) is calculated in consideration of only the degree of inclination of the chuck top 29 (Step S906).

Subsequently, whether the degree of inclination calculated in Step S905 or Step S906 falls within a tolerance range is determined (Step S907). If it is determined that the degree of inclination falls outside the tolerance range, whether the number of times of inclination adjustments executed thus far falls within a set value is determined (Step S908). If the number of times falls within the set value, it is determined whether the degree of inclination of the chuck top 29 for maintaining the wafer W in a parallel relationship with the probe card 19, which is calculated based on the degree of inclination calculated in Step S905 or Step S906, falls within an adjustable range through the lifting performed by the actuators 47 (Step S909). If the degree of inclination of the chuck top 29 falls within the adjustable range, the degree of inclination of the chuck base 49 (the wafer W) relative to the probe card 19 is adjusted by the actuators 47 in order to achieve the degree of inclination of the chuck top 29 for maintaining the wafer W in a parallel relationship with the probe card 19 (Step S910). Thereafter, the process returns to Step S901.

If it is determined in Step S902 that the wafer inspection device 10 does not include the wafer inclination adjusting mechanism, it is determined whether the degree of inclination of the wafer W relative to the probe card 19, which is calculated from the checked degree of inclination of the chuck top 29 or the probe card 19, falls within a tolerance range (Step S911). If it is determined that the degree of inclination falls within the tolerance range, the process is ended. Meanwhile, if it is determined that the degree of inclination falls outside the tolerance range, an error is displayed on a display part or the like of the wafer inspection device 10 (Step S912) and then the process is ended.

If it is determined in Step S907 that the degree of inclination calculated in Step S905 or Step S906 falls within the tolerance range, the process is ended. If it is determined in Step S908 that the number of times of inclination adjustments performed thus far falls outside the set value, or if it is determined in Step S909 that the degree of inclination of the chuck top 29 for maintaining the wafer W in a parallel relationship with the probe card 19 falls outside the adjustable range by the lifting performed by the actuators 47, it is determined whether the degree of inclination of the wafer W relative to the probe card 19, which is calculated from the checked degree of inclination of the chuck top 29 or the probe card 19, falls within a tolerance range (Step S913). If it is determined that the degree of inclination falls within the tolerance range, the process is ended. If it is determined that the degree of inclination falls outside the tolerance range, an error is displayed on the display part or the like of the wafer inspection device 10 (Step S914) and then the process is ended.

Although the present disclosure has been described by way of the above embodiment, the present disclosure is not limited thereto.

For example, the degree of inclination of the chuck base 49 (the chuck top 29) obtained by inspecting a previous wafer W may be stored in a certain tester 15. When the tester 15 inspects a new wafer W, the actuators 47 may be operated in order to achieve the stored degree of inclination of the chuck base 49 (chuck top 29) before checking the degree of inclination of the chuck base 49 (the chuck top 29) with the tester-side camera 16. Accordingly, it is possible to increase the possibility that the degree of inclination of the wafer W relative to the probe card 19 falls within the tolerance range before adjusting the degree of inclination of the wafer W relative to the probe card 19. Thus, it is possible to improve throughput in the wafer alignment process.

Further, the present disclosure is accomplished by providing a storage medium that stores a program code of software for implementing the functions of the embodiment described above is recorded, to the controller 17*d* installed in the wafer inspection device 10, and allowing a CPU of the controller 17*d* to read out and execute the program code stored in the storage medium.

In this case, the program code itself read out from the storage medium implements the functions of the above embodiment. Thus, the program code and the storage medium storing the program code constitute the present disclosure.

Further, as the storage medium for supplying the program code, for example, a RAM, an NV-RAM, a floppy (registered trademark) disk, a hard disk, a magneto-optical disc, and an optical disc such as a CD-ROM, a CD-R, a CD-RW, a DVD (DVD-ROM, DVD-RAM, DVD-RW, DVD+RW), a magnetic tape, a nonvolatile memory card, other ROMs or the like may be used as long as they can store the program code. Alternatively, the program code may be downloaded from other computer or databases (not shown) connected to an internet, a common network, a local area network or the like, and may be supplied to the controller 17*d*.

Further, the respective functions of the above embodiments may be implemented by executing the program code which is read by the controller 17*d*, and by allowing an OS (operating system) running on the CPU to execute some or all of the actual processes based on instructions of the program code.

Further, the respective functions of the above embodiments may be implemented by writing the program code read from the memory medium into a memory provided in a function expansion board inserted into the controller 17*d* or a function expansion unit connected to the controller 17*d*, and by allowing a CPU or the like provided in the function expansion board or the function expansion unit to execute some or all of the actual processes based on instructions of the program code.

The program code may be configured in a form such as an object code, a program code executed by an interpreter, a script data provided to the OS, or the like.

This application claims the benefit of Japanese Patent Application No. 2015-194389, filed on Sep. 30, 2015, in the Japan Patent Office, the disclosure of which is incorporated herein in its entirety by reference.

EXPLANATION OF REFERENCE NUMERAL

W: wafer
10: wafer inspection device
16: tester-side camera
18: conveying stage
19: probe card
29: chuck top
32: aligner
47: actuator
55: positioning pin
57: positioning block
59: heater
60: cooler
62: upper checking camera

The invention claimed is:

1. A wafer inspection device including a plurality of tester rows composed of a plurality of testers that is horizontally arranged and a conveying stage provided for each of the plurality of tester rows, comprising:
a first camera disposed for each of the plurality of tester rows and configured to move along a respective tester row of the plurality of tester rows,
wherein each of the plurality of testers includes a probe card having a plurality of contact terminals formed to protrude toward a wafer, and
the conveying stage is configured to mount the wafer thereon and to move toward the probe card,
wherein the conveying stage includes an aligner and a chuck top mounted on the aligner, the aligner and the chuck top being separated from each other,
the wafer is mounted on the chuck top,
the aligner includes an inclination adjusting mechanism configured to adjust an inclination of the chuck top relative to the probe card so as to maintain the wafer in a parallel relationship with the probe card,
the wafer inspection device further comprising: an inclination checking mechanism configured to check a degree of inclination of the chuck top and a degree of inclination of the probe card,
wherein the inclination checking mechanism includes the first camera and a second camera, the first camera being configured to check the degree of inclination of the chuck top with respect to a horizontal plane and the second camera being disposed in the aligner and configured to check the degree of inclination of the probe card with respect to the horizontal plane.

2. The wafer inspection device of claim 1, further comprising:
a plurality of probe cards,
wherein each of the plurality of probe cards includes a temperature adjusting mechanism.

3. The wafer inspection device of claim 1, wherein the chuck top includes another temperature adjusting mechanism.

4. The wafer inspection device of claim 1, further comprising:
a position setting mechanism configured to setting a position of the chuck top with respect to the aligner.

5. The wafer inspection device of claim 4, wherein the position setting mechanism includes a plurality of positioning pins provided in the aligner and a plurality of positioning blocks provided in the chuck top,
wherein the plurality of positioning pins and the plurality of positioning blocks are engaged with each other to set the position of the chuck top with respect to the aligner in an X-direction, a Y-direction, a Z-direction, and a θ-direction.

6. The wafer inspection device of claim 1, wherein the aligner further includes a chuck base configured to mount the chuck top on a surface of the chuck base and actuators configured to lift the chuck base, and
wherein lifting amounts of the actuators are individually adjustable.

7. A wafer inspection method of bringing a probe card into contact with a wafer mounted on a chuck top, in a wafer inspection device including a plurality of tester rows composed of a plurality of testers that is horizontally arranged and a conveying stage provided for each of the plurality of tester rows, each of the plurality of testers being provided with the probe card having a plurality of contact terminals formed to protrude toward the wafer, and the conveying stage being provided with an aligner and the chuck top mounted on the aligner, the method comprising:
an inclination checking step of checking a degree of inclination of the chuck top with respect to a horizontal plane and a degree of inclination of the probe card with respect to the horizontal plane, an inclination adjusting step of adjusting the inclination of the chuck top relative to the probe card so as to maintain the wafer in a parallel relationship with the probe card; and a moving step of moving the chuck top with the wafer mounted thereon toward the probe card; and disposing a first camera for each of the plurality of tester rows, the first camera being configured to move along a respective tester row of the plurality of tester rows, wherein the inclination checking step includes:

allowing the first camera to check the degree of inclination of the chuck top; and allowing a second camera disposed in the aligner to check the degree of inclination of the probe card.

8. The wafer inspection method of claim 7, wherein the aligner is disposed to adjust the inclination of the chuck top with respect to the probe card, the method comprising: setting a position of the chuck top with respect to the aligner.

9. The wafer inspection method of claim 7, wherein the aligner further includes a chuck base configured to mount the chuck top on a surface of the chuck base and actuators configured to lift the chuck base, and wherein the inclination adjusting step further includes individually adjusting lifting amounts of the actuators.

* * * * *